(12) United States Patent
Feyh et al.

(10) Patent No.: US 9,187,314 B2
(45) Date of Patent: *Nov. 17, 2015

(54) ANISOTROPIC CONDUCTOR AND METHOD OF FABRICATION THEREOF

(71) Applicant: Robert Bosch GmbH, Stuttgart (DE)

(72) Inventors: Ando Lars Feyh, Palo Alto, CA (US); Fabian Purkl, Palo Alto, CA (US); Ashwin K. Samarao, Mountain View, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/200,991

(22) Filed: Mar. 7, 2014

(65) Prior Publication Data

US 2014/0264900 A1    Sep. 18, 2014

Related U.S. Application Data

(60) Provisional application No. 61/787,141, filed on Mar. 15, 2013.

(51) Int. Cl.
| | |
|---|---|
| H01L 21/3205 | (2006.01) |
| H01L 23/52 | (2006.01) |
| B81C 1/00 | (2006.01) |
| H01L 21/314 | (2006.01) |
| H01L 21/02 | (2006.01) |
| H01L 45/00 | (2006.01) |
| B82Y 10/00 | (2011.01) |
| B82Y 30/00 | (2011.01) |

(52) U.S. Cl.
CPC ............ *B81C 1/00095* (2013.01); *B82Y 10/00* (2013.01); *B82Y 30/00* (2013.01); *H01L 21/02601* (2013.01); *H01L 21/3142* (2013.01); *H01L 45/146* (2013.01)

(58) Field of Classification Search
CPC ............ H01L 45/146; H01L 21/02601; H01L 21/3142; B82Y 10/00; B82Y 30/00
USPC .................. 438/287, 382, 763; 257/411, 537; 977/721, 779, 936
See application file for complete search history.

(56) References Cited

U.S. PATENT DOCUMENTS

| | | |
|---|---|---|
| 6,946,336 B2 | 9/2005 | Pang et al. |
| 2007/0092989 A1* | 4/2007 | Kraus et al. ..................... 438/99 |

(Continued)

OTHER PUBLICATIONS

International Search Report and Written Opinion corresponding to PCT Application No. PCT/US2014/022175, mailed Dec. 15, 2014 (10 pages).

*Primary Examiner* — George Fourson, III
(74) *Attorney, Agent, or Firm* — Maginot Moore & Beck LLP

(57) ABSTRACT

An anisotropic conductor and a method of fabrication thereof. The anisotropic conductor includes an insulating matrix and a plurality of nanoparticles disposed therein. A first portion of the plurality of nanoparticles provides a conductor when subjected to a voltage and/or current pulse. A second portion of the plurality of the nanoparticles does not form a conductor when the voltage and or current pulse is applied to the first portion. The anisotropic conductor forms a conductive path between conductors of electronic devices, components, and systems, including microelectromechanical systems (MEMS) devices, components, and systems.

20 Claims, 4 Drawing Sheets

(56) References Cited

U.S. PATENT DOCUMENTS

| | | |
|---|---|---|
| 2008/0296650 A1 | 12/2008 | Ahn et al. |
| 2009/0173991 A1* | 7/2009 | Marsh et al. .................. 257/324 |
| 2009/0302365 A1* | 12/2009 | Bhattacharyya ............. 257/298 |
| 2009/0302371 A1 | 12/2009 | Kraus et al. |
| 2010/0264333 A1* | 10/2010 | Offermans et al. ........ 250/459.1 |
| 2011/0186799 A1* | 8/2011 | Kai et al. .......................... 257/3 |
| 2011/0227142 A1 | 9/2011 | Ramaswamy et al. |
| 2013/0148126 A1* | 6/2013 | Walters et al. ................. 356/445 |
| 2014/0091281 A1* | 4/2014 | Cheng et al. .................... 257/39 |
| 2014/0197369 A1* | 7/2014 | Sheng et al. ...................... 257/4 |
| 2014/0264224 A1* | 9/2014 | Zhang et al. ...................... 257/2 |
| 2014/0264900 A1* | 9/2014 | Feyh et al. ..................... 257/773 |

\* cited by examiner

ANISOTROPIC CONDUCTOR AND METHOD OF FABRICATION THEREOF

This application claims the benefit of U.S. Provisional Application No. 61/787,141, filed Mar. 15, 2013, the entire disclosure of which is herein incorporated by reference.

TECHNICAL FIELD

This disclosure relates to electronic devices and more particularly to microelectromechanical system (MEMS) devices and a conductor for MEMS devices.

BACKGROUND

Electronic devices including two or more parts or components require an electrical connection between at least two of the parts. While such electrical connections are well understood and dependably achieved, electrical connections between parts or components of miniaturized devices, such as those constructed by semiconductor fabrication techniques, require increasingly sophisticated techniques to electrically connect one part to another part. For the fabrication of MEMS devices, the electrical connection between parts becomes particularly critical since MEMS devices include both electrical and mechanical components having sizes of between 1 to 100 micrometers (i.e. 0.001 to 0.1 mm) where a completed MEMS device generally ranges in size from twenty (20) micrometers (20 millionths of a meter) to a millimeter (i.e. 0.02 to 1.0 mm).

In a MEMS device having distinct vertically oriented layers, typically composed of a substrate such as silicon, one or more local electrical contacts are formed between the two vertically oriented and distinct layers. Because the layers are separated, a connection is typically made between the two layers by depositing one or more metallic films on a surface of a first substrate which interfaces with a surface of a second substrate or a second vertical layer on the same substrate. The one or more metallic films are deposited on the substrates or devices and are patterned in order to provide locally conductive areas, electrically separated from each other.

The formation of the metallic films, which become conductors, involves several process steps, including the deposition of a first layer of metallic film, patterning the first layer, and then depositing additional layers and further patterning if required. Each layer which is to be connected requires its own conductor and consequently, the location of the conductors on each layer is critical to form a component or device. This multi-step process increases cost and requires a certain safety margin between two horizontally neighboring contacts.

In one type of conductor formation process, an anisotropic material is first deposited on a base substrate, such as silicon. This formation can be accomplished be using a lamination process by the deposition of a film. The material is then patterned if necessary. A second substrate is then placed in position over the base substrate and the two substrates are pressed together. In some instances, a small amount of heat is applied to cause the two interfacing substrates to adhere to one another.

Once the two substrates are mated, the two substrates are bonded by heating with temperatures that can be as high as 100° C., where the heat is applied for a relatively short period of time, on the order of one second or less. Temperatures, heat application times, and pressures applied vary depending on the type of substrates and the anisotropic materials being used.

In another type of conductor formation process, a first conductive layer is formed on a substrate followed by the deposition of an isolation material. The dielectric material is etched away in locations, where a connection is to be made. Then, a second conductive material is deposited and makes a connection to the first layer in the selected regions.

Consequently, there is a need for reducing the complexity of the processes used to form conductive layers on devices, components, and substrates.

SUMMARY

The present disclosure relates to the field of electronic devices and in particular to the field of microelectromechanical systems and devices, including micromachined systems and devices, including those configured to sense a wide variety of conditions including pressure, sound, and environmental conditions such as humidity. MEMS devices include sensors and actuators typically formed on or within a substrate such as silicon.

Devices other than sensors also benefit from the use of the described anisotropic conductor and method for the fabrication of an anisotropic conductor. For instance, micromachined mechanical devices, such as micromachined motors, are fabricated using the described anisotropic conductors. Micromachined accelerometers also benefit. In addition, this method can be used to selectively connect different parts of an integrated circuit.

The present disclosure provides an anisotropic conducting layer and a method of fabrication therefore which, in one embodiment, eliminates some or all of the requirements for patterning conductors in a system, device or component. In addition, the number of multiple layers of material being deposited to form a known conductor is reduced and in some cases a significant reduction in the number of layers is achieved. Furthermore, the density between electrical interconnects, in some embodiments, is drastically reduced.

A method of forming an electronic device in one embodiment includes forming a base portion including a base layer, forming at least one first electrode on an upper surface of the base layer, forming a first insulating layer on the upper surface of the base layer and the at least one first electrode using atomic layer deposition (ALD), depositing a first plurality of noble metal nanoparticles on an upper surface of the first insulating layer, forming a second insulating layer on portions of the upper surface of the first insulating layer and on the first plurality of noble metal nanoparticles by ALD, and forming at least one second electrode above the second insulating layer and aligned with the at least one first electrode.

An electronic device in one embodiment includes base portion, a first electrode on a surface of the base portion, a passivation layer on the base portion, the passivation layer including an insulating base layer formed by atomic layer deposition (ALD) on the surface of the base portion, a matrix of insulating material and noble metal nanoparticles formed on the base layer using ALD, and an insulating cap layer formed by ALD on the matrix, and a second electrode aligned with the first electrode and positioned on a side of the passivation layer opposite to the first electrode.

DESCRIPTION

Figure 1:
FIG. 1 depicts a transmission electron microscope (TEM) image of an electronic device including a passivation layer with a matrix having a first thickness.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIGS. 1-4 depict TEM images of an electronic device 100 including a passivation layer 102. The electronic device 100 includes a base portion 104 on which the passivation layer 102 is formed. While depicted as being formed on an upper surface of the base portion 104, the passivation layer 102 may be formed additionally and/or alternatively on sides of the base portion 104.

Figure 2:
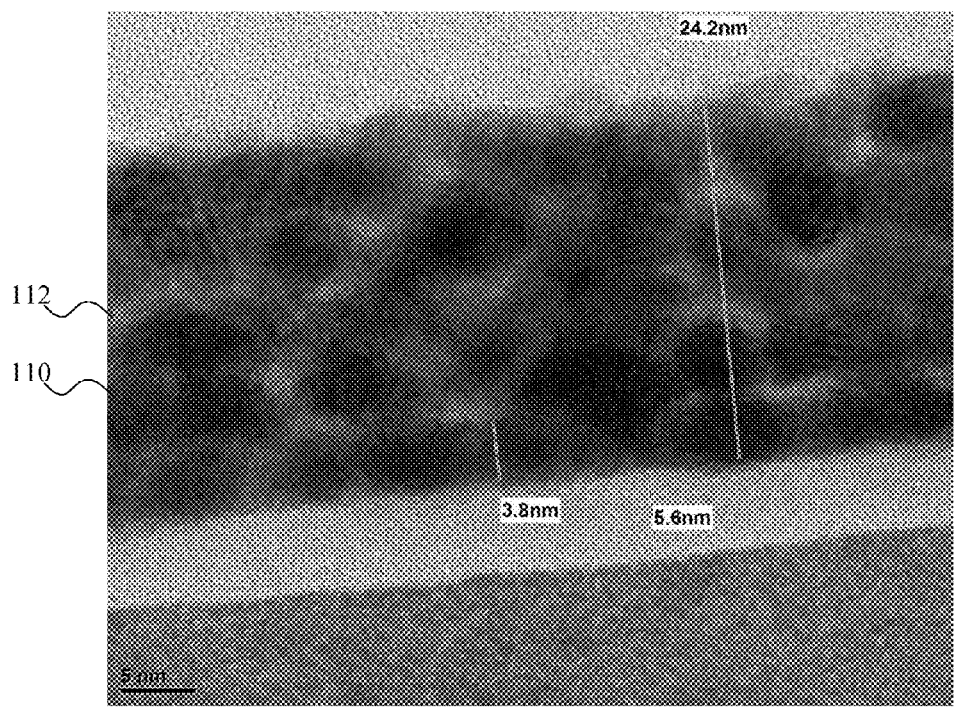
FIG. 2 shows a magnified view of the TEM image of FIG. 1 illustrating an insulating material portion and a nanoparticle portion of the matrix.

The passivation layer 102 includes a base layer 106 formed with an insulating material using a process such as ALD, although PVD is used in another embodiment. In the embodiment of FIGS. 1-2, the base layer 106 is of $Al_2O_3$ formed to provide a thickness on the order of 5-6 nm. In other embodiments, the base layer is a few angstroms in thickness.

Figure 3:
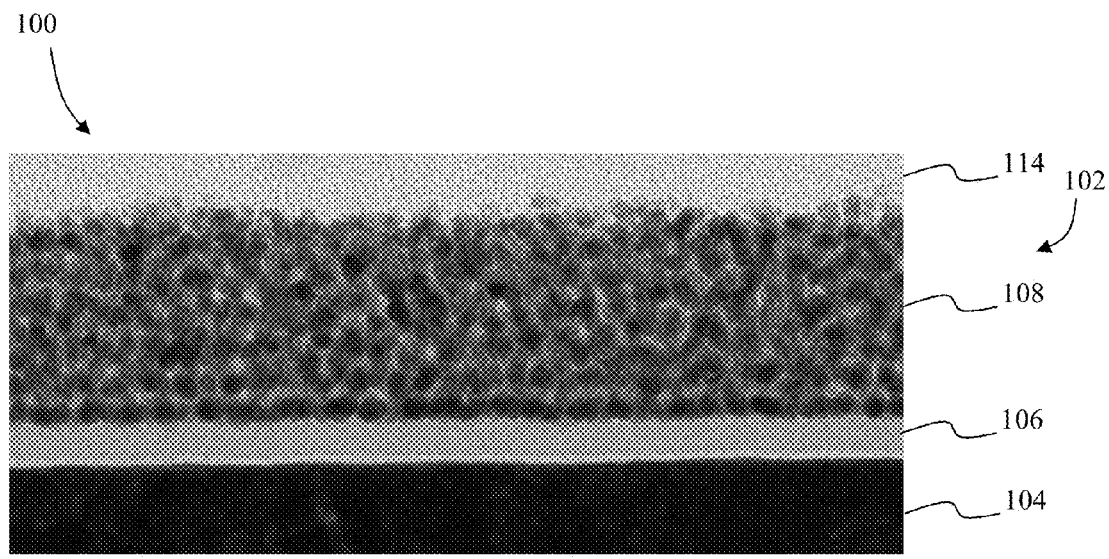
FIG. 3 depicts a TEM image of another electronic device including a passivation layer with a matrix having a second thickness.
Figure 4:
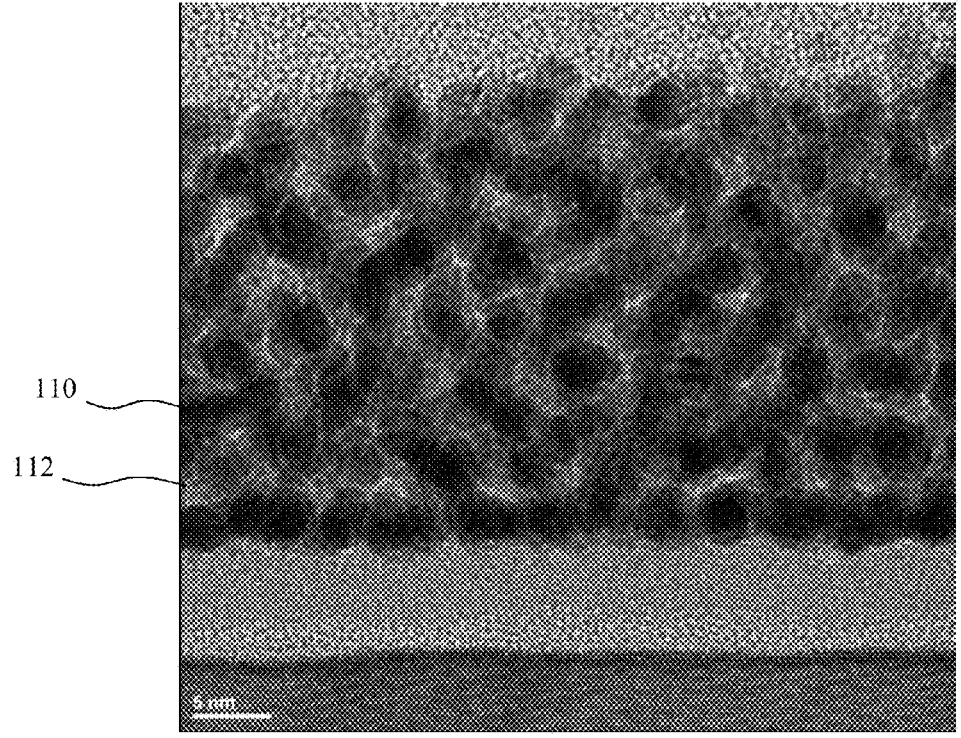
FIG. 4 shows a magnified view of the TEM image of FIG. 3 illustrating an insulating material portion and a nanoparticle portion of the matrix.

A matrix 108 including noble metal nanoparticles 110 (which appear as large dark circular objects, particularly in FIGS. 2-4) and insulating material 112 (which is similar in appearance to the base layer 106) is located above the base layer 106. In FIG. 2, five layers of noble metal nanoparticles 110 can be discerned. Each layer of nanoparticles is separated from the adjacent layer of nanoparticles by a layer of insulating material, resulting in four intermediate layers of insulating material. The noble metal nanoparticles 110 in this embodiment are platinum noble metal nanoparticles with a diameter of about 4 nm. The total thickness of the matrix 108 is about 24.2 nm. Accordingly, each layer of insulating material (like the layer 16) is about 1 nm in thickness.

In FIGS. 3 and 4, approximately seven layers of the noble metal nanoparticles 110 can be discerned. Similar to the layers of the nanoparticles shown in FIG. 2, each layer of the nanoparticles shown in FIGS. 3 and 4 is separated from the adjacent layer of nanoparticles by a layer of insulating material, resulting in six intermediate layers of insulating material. The noble metal nanoparticles 110 in this embodiment are similarly platinum noble metal nanoparticles with a diameter of about 4 nm. Accordingly, the total thickness of the matrix 108 shown in FIGS. 3 and 4 is greater than 24.2 nm.

In the embodiments of FIGS. 1-4, a cap layer 114 of insulating material is provided above the uppermost layer of noble metal nanoparticles. The cap layer 114 is much thicker than the base layer 106 in these embodiments. In other embodiments, the cap layer 114 is about the same thickness as the intermediate insulation layers, or thinner.

The passivation layer 104 prevents electrical short circuiting of different sensor/device areas. Platinum is described as being used as the noble metal nanoparticle in the foregoing example, but other noble metals such as gold (Au) are known to be extremely inert against harsh or disruptive environments such as those that are chemically aggressive. Accordingly, in other embodiments nanoparticles of other noble metal are used. In other embodiments using other noble metals, the nanoparticles are preferably substantially the same size as the platinum nanoparticles of FIGS. 1-4. Materials other than noble metal are also known to be resilient against harsh or disruptive environments. Accordingly, in other embodiments nanoparticles of material other than noble metal, such as Aluminum, Titanium, Titanium Nitride, Tungsten, and Ruthenium, are used. In addition, while Al2O3 is described as being used for the insulation material, in other embodiments other insulating materials, including Hafnium Oxide (HfO2) and Zirconium Dioxide (ZrO2), or combinations thereof, are used. The term "electronic device" is not meant to be limiting to any one specific device and includes devices such as a sensor, an integrated circuit, and an interposer. Accordingly, the term "base portion" as used herein can include any portion of a sensor, an integrated circuit, an interposer, or the like on which a passivation layer is formed.

Figure 5:
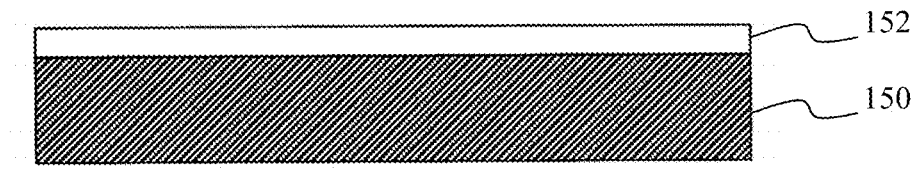
FIGS. 5-8 depict a process for forming a passivation layer on a base portion of an electronic device.

FIGS. 5-8 depict a process for forming a passivation layer on a base portion 150, which in one embodiment includes an outer layer of silicon. Referring initially to FIG. 5, a base layer 152 is deposited on the base portion 150. The base portion 150 in one embodiment is formed in accordance with any desired process. In some embodiments, the base portion 150 is an outer layer of the sensor area, or even a membrane of a sensor area.

The base layer 152 is a layer of insulating material. In one embodiment, the base layer 152 is a thin $Al_2O_3$ layer, having a thickness of a few Angstroms. In some embodiments, the base layer 152 is a few nanometers thick. The base layer 152 may be deposited on a base portion formed of a material such as silicon, adjacent to one or more conductors formed on the base portion. The base layer 152 provides a base layer of insulating material which substantially prevents electrical short circuiting of different areas of the devices being formed including MEMS sensors and accelerometers.

Figure 6:
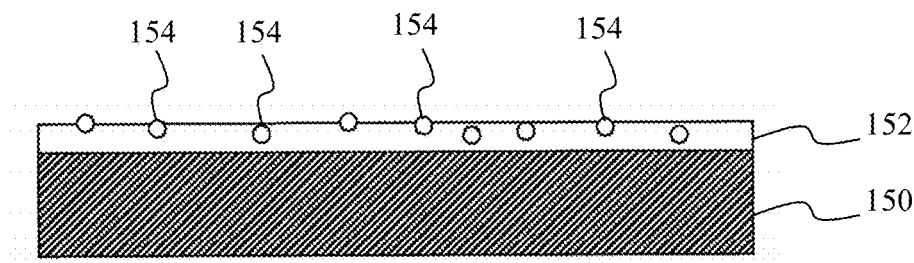

Formation of the passivation layer continues by using a switched process of atomic layer deposition (ALD). After the base layer of insulating material such as Aluminum Oxide ($Al_2O_3$) is deposited to form the base layer 152, a layer of noble metal nanoparticles 154 such as platinum (Pt) is deposited on the base layer 152 as illustrated in FIG. 6. The deposition process of the layer of noble metal nanoparticles 154 is controlled in a way that individual nanoparticles 154 are formed. In one embodiment, the nanoparticles 154 are Pt crystals. FIG. 6 is for illustrative purposes only and the circles representing the nanoparticles 154 do not represent an actual size of the nanoparticles with respect the thickness of the film 152, nor do the respective locations of the nanoparticles represent the distance between nanoparticles.

While the layer of noble metal nanoparticles 154 may be thicker than the base layer 152, the thickness of the layer of noble metal nanoparticles 154 is controlled to be less than the thickness at which the noble metal coalescences, for instance approximately four (4) nanometers for Pt. Consequently, individual nanoparticles are realized, not a continuous layer, once the process for depositing the layer of nanoparticles 154 is completed. Because the thickness of the layer of noble metal nanoparticles 154 is limited, if a different thickness is desired for a passivation layer, the above steps are repeated, as desired to obtain the desired thickness.

Figure 7:
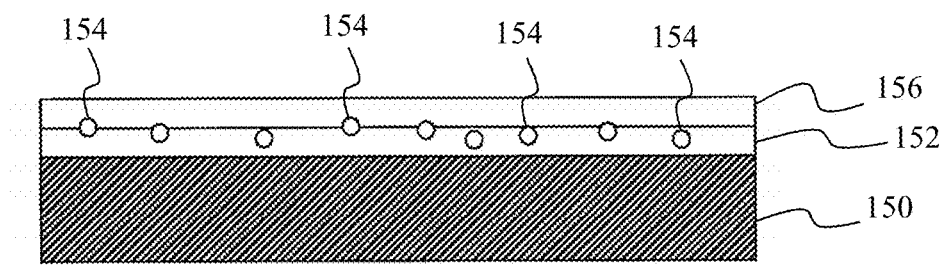
Figure 8:
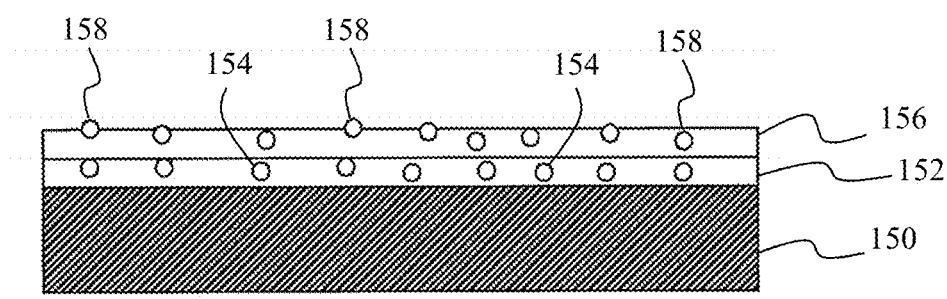

For example, as illustrated in FIG. 7, a second layer 156 of insulating material is deposited on the layer 152 and on the nanoparticles 154. If the thicker passivation layer is desired, a second layer of nanoparticles 158 such as platinum nanoparticles is deposited on the second layer 156 (see FIG. 8). The steps are thus repeated as needed to obtain the desired thickness. In some embodiments, a stack of four to fifty or more layers of insulating material and noble metals are used. In one embodiment, the final layer of insulating material is formed to be thicker than any of the intermediate insulating layers to form a cap layer such as the cap layer 114.

Because of the manner in which the various layers in the passivation layer are formed, it is possible to mix materials if desired for a particular application. For example, the different layers of insulation material may be formed using different materials and the different layers of noble metals may be formed with different metals.

Figure 9:
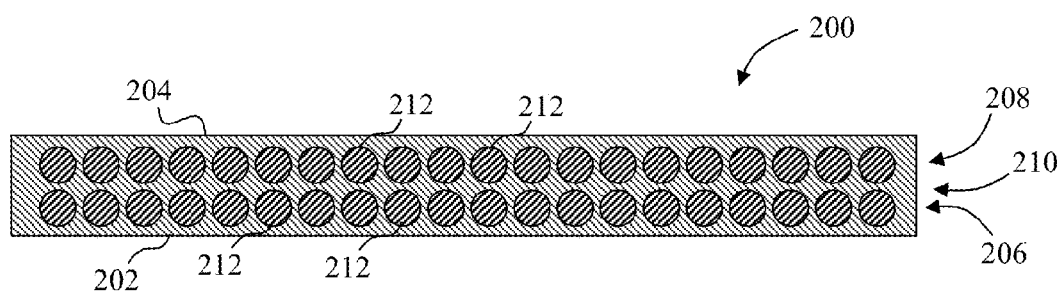
FIG. 9 illustrates an initial condition in a process for fabrication of an anisotropic conductor within a passivation layer.

While the above process provides a passivation layer which insulates and protects underlying devices, it is sometimes desired to provide electrical connections through the passivation layer. FIG. 9 illustrates an initial condition in a process for fabrication of an anisotropic conductor within a passivation layer such as the passivation layer 102. In FIG. 9, a passivation layer 200 includes a lower insulation layer 202 and upper insulation layer 204. The passivation layer 200 further includes two layers 206/208 of noble metal nanoparticles, and an intermediate insulation layer 210. Within the layers 206/208 of noble metal nanoparticles, a number of nanoparticles 212 are depicted. The passivation layer 200 may be formed in accordance with the process discussed above.

Figure 10:
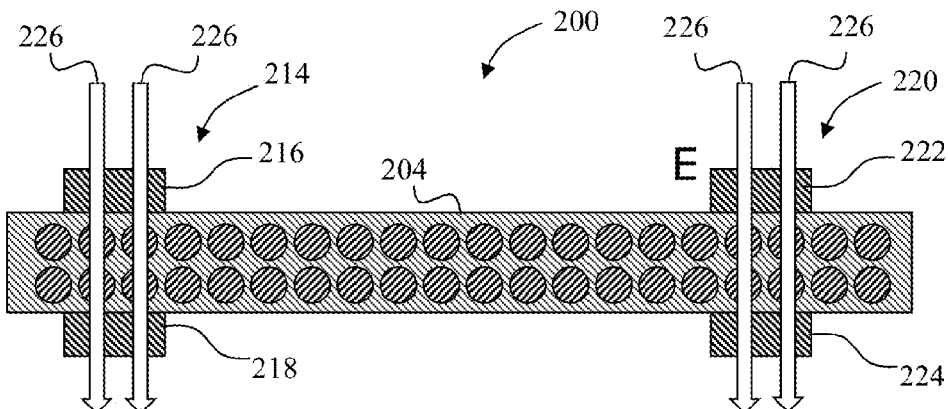
FIG. 10 illustrates a first electrode pair and a second electrode pair formed on the passivation layer with a current pulse and/or voltage pulse being applied at the electrodes.

Next, one or more electrode pairs are formed at locations for which conduction through the passivation layer 200 is desired. FIG. 10 illustrates a first electrode pair 214, including electrodes 216 and 218, and a second electrode pair 220 including electrodes 222 and 224. The electrodes 218 and 224 are formed on the underlying base portion while the electrodes 216 and 22 are formed on an upper surface of the upper insulation layer 204.

Once the electrode pairs 214/220 are in place, a current pulse and/or voltage pulse is applied at the electrodes as indicated by arrows 226. In response to the application of the pulse or pulses, an electric break-through in the areas or portions of the passivation layer 200 is achieved within the passivation layer 200 and through the nanoparticles 212 between opposed pairs of electrodes. Because the amount of insulating matrix material is very small in the vertical film direction as illustrated by the arrows 226, the electric break-through occurs in the vertical direction but not along the horizontal direction, since the insulating property of the passivation layer 200 is too great for the pulses to move through the $Al_2O_3$ layer from one conductor pair 214 to the other conductor pair 220. In some embodiments, the voltage and/or current applied to force tunneling to occur is greater than the voltage and/or current experienced by the device during normal operation.

Figure 11:
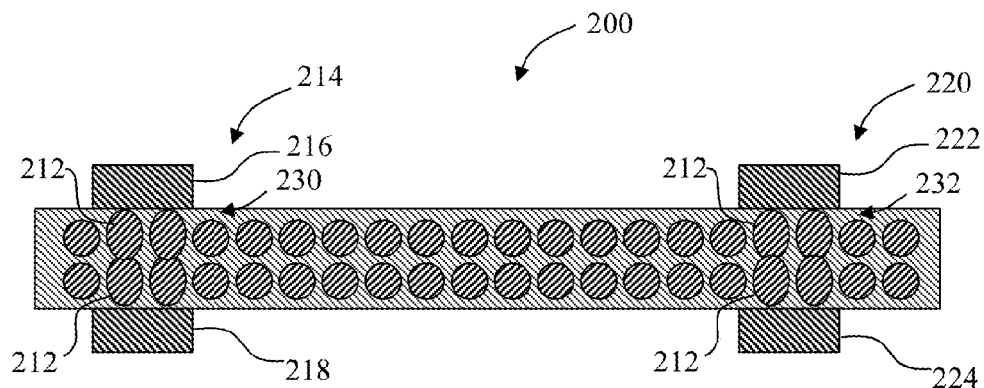
FIG. 11 illustrates the resulting conductive path or conductivity of the passivation layer formed in the vertical direction in response to the current pulse and/or voltage pulse.

FIG. 11 illustrates the resulting conductive path or conductivity of the passivation layer 200 formed in the vertical direction as a result of the above described tunneling as the nanoparticles 212 between opposed pairs of electrodes 216/218 and 222/222 are depicted as elongated. The passivation layer 200, however, exhibits a high electrical insulation along the horizontal direction. Consequently, an anisotropic conductor 230 and an anisotropic conductor 232 are formed at the first and second conductor pairs 214 and 220. In another embodiment, the tunneling effect is used in order to realize anisotropic conductivity. The effective tunneling barrier in vertical direction is much lower than in horizontal direction as the number of tunnel barriers varies. Therefore no punch-through of the oxides is required for this alternative embodiment.

The described conductor has many application including MEMS sensors including for instance gas sensors with insulated arrays having different sensitivities. Those of skill in the art will recognize that the processes described herein in other embodiments are modified to provide a variety of configurations designed for the particular embodiment.

The devices, components and substrates which include the conductors of the present invention can be embodied in a number of different types and configurations and can be formed according to a number of different methods of fabrication. The following embodiments are provided as examples and are not intended to be limiting.

In one embodiment, a method for fabricating an anisotropic conducting material is used to provide an electrical connection for sensors, including MEMS sensors. An anisotropic conducting material in one embodiment is formed of one or more layers of nanoparticles of a conductive material, embedded in an insulating matrix and thereby overall insulating. In one embodiment, a method for fabricating an anisotropic conducting material includes using atomic layer deposition. A method for fabricating an anisotropic conducting material in one embodiment includes using a physical vapor deposition (PVD) process.

In one embodiment a method for fabricating an anisotropic conducting material includes forming a local conduction path by applying a current and/or voltage pulse on the film and thereby generating electrical break-through of an insulating matrix. A method for fabricating an anisotropic conducting material in one embodiment includes providing a contact with a smaller horizontal distance compared to lithography-enabled processes. In one embodiment, a method for fabricating an anisotropic conducting material includes using conductive nanoparticles having a dimension of approximately one to ten nanometers. (1-10 nm). A method for fabricating an anisotropic conducting material in one embodiment includes forming an insulating film having a distance of 0.05-5 nm between the nanoparticles.

In one embodiment, a method for fabricating an anisotropic conducting material includes forming a local conduction path by applying a laser pulse, or other form of energy to the conducting material. A method for fabricating an anisotropic conducting material in one embodiment includes areas of insulating material where no local conduction path was formed. In one embodiment, a method for fabricating an anisotropic conducting material includes using a tunnel-effect, in order to overcome the conduction-barrier in a vertical direction, without applying a voltage and/or current pulse for local break-through of a conduction path.

In one embodiment, an electrical conductor for connecting a first contact to a second contact includes a plurality of first layers of thin film and a plurality of second layers, each of the plurality of first layers alternating with each of the plurality of second layers, each of the plurality of the second layers including separated nanoparticles in non-contacting relation with adjacent nanoparticles, wherein a portion of adjacent first layers and second layers are configured to form a conductive portion. An electrical conductor in one embodiment includes a conductive portion with a plurality of unseparated nanoparticles. In one embodiment, an electrical conductor includes a portion of separated nanoparticles disposed between a first and a second portion of the plurality of unseparated nanoparticles.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of forming an electronic device, comprising:
forming a base portion including a base layer;
forming at least one first electrode on an upper surface of the base layer;
forming a first insulating layer on the upper surface of the base layer and the at least one first electrode using atomic layer deposition (ALD);
depositing a first plurality of nanoparticles on an upper surface of the first insulating layer;
forming a second insulating layer on portions of the upper surface of the first insulating layer and on the first plurality of nanoparticles by ALD; and
forming at least one second electrode above the second insulating layer and aligned with the at least one first electrode.

2. The method of claim 1, wherein:
forming at least one first electrode comprises forming a plurality of first electrodes on the upper surface of the base layer; and
forming at least one second electrode comprises forming a plurality of second electrodes above the second insulating layer, each of the plurality of second electrodes aligned with a respective one of the plurality of first electrodes.

3. The method of claim 1, wherein the second insulating layer is a type of insulating material different from a type of insulating material of the first insulating layer.

4. The method of claim 1, wherein depositing the first plurality of nanoparticles comprises:
depositing a first plurality of nanoparticles to a thickness less than a coalescence thickness of the first plurality of nanoparticles.

5. The method of claim 1, further comprising:
depositing a second plurality of nanoparticles on an upper surface of the second insulating layer; and
forming a third insulating layer on portions of the upper surface of the second insulating layer and on the second plurality of nanoparticles by ALD.

6. The method of claim 4, wherein the second plurality of nanoparticles is a type of material different from a type of material of the first plurality of nanoparticles.

7. The method of claim 1, wherein the passivation layer is formed at a deposition temperature of less than 300° C.

8. The method of claim 1, wherein:
forming the first insulating layer comprises forming the first insulating layer at a deposition temperature of less than 300° C.;
depositing the first plurality of nanoparticles comprises depositing the first plurality of nanoparticles at a deposition temperature of less than 300° C.; and
forming the second insulating layer comprises forming the second insulating layer at a deposition temperature of less than 300° C.

9. The method of claim 1, wherein:
depositing the first plurality of nanoparticles comprises depositing a first plurality of noble metal nanoparticles.

10. The method of claim 1, wherein
forming the first insulating layer comprises forming a first insulating layer of aluminum oxide ($Al_2O_3$), hafnium oxide ($HfO_2$), or zirconium dioxide ($ZrO_2$) on the upper surface of the base layer using ALD; and
forming the second insulating layer comprises forming a second insulating layer of aluminum oxide ($Al_2O_3$), hafnium oxide ($HfO_2$), or zirconium dioxide ($ZrO_2$) on the portions of the upper surface and on the first plurality of nanoparticles by ALD.

11. The method of claim 1, wherein
forming the first insulating layer comprises forming a first insulating layer with a thickness of between 0.05 and 1 nm; and
forming the second insulating layer comprises forming a second insulating layer with a thickness of between 0.05 and 1 nm.

12. The method of claim 1, further comprising;
determining a desired thickness of a passivation layer; and
alternatively depositing additional nanoparticles and forming additional insulating layers above the third insulating layer until a combined thickness of the first insulating layer, first plurality of nanoparticles, second insulating layer, additional nanoparticles, and additional insulating layers is at the desired thickness.

13. An electronic device, comprising:
base portion;
a first electrode on a surface of the base portion;
a passivation layer on the base portion, the passivation layer including
an insulating base layer formed by atomic layer deposition (ALD) on the surface of the base portion,
a matrix of insulating material and nanoparticles formed on the base layer using ALD, and
an insulating cap layer formed by ALD on the matrix; and
a second electrode aligned with the first electrode and positioned on a side of the passivation layer opposite to the first electrode.

14. The electronic device of claim 13, further comprising:
a third electrode on the surface of the base portion; and
a fourth electrode aligned with the third electrode and positioned on a side of the passivation layer opposite to the third electrode.

15. The electronic device of claim 13, wherein the matrix comprises:
a first plurality of nanoparticles on the base layer;
a first insulating layer between the first plurality of nanoparticles and the cap layer; and
a second plurality of nanoparticles between the first insulating layer and the cap layer.

16. The electronic device of claim 15, wherein the second plurality of nanoparticles is a type of material different from a type of material of the first plurality of nanoparticles.

17. The electronic device of claim 15, wherein the first insulating layer is a type of insulating material different from a type of insulating material of the base layer.

18. The electronic device of claim 13, wherein the nanoparticles are deposited in a layer having a thickness below a coalescence thickness of the nanoparticles.

19. The electronic device of claim 18, wherein the nanoparticles are noble metal nanoparticles.

20. The electronic device of claim 18, wherein the base layer is formed with an insulating material selected from the group consisting of:
 aluminum oxide ($Al_2O_3$);
 hafnium oxide ($HfO_2$); and
 zirconium dioxide ($ZrO_2$).

\* \* \* \* \*